United States Patent
Eldredge

(10) Patent No.: US 8,514,118 B2
(45) Date of Patent: Aug. 20, 2013

(54) SIGMA-DELTA MODULATION WITH REDUCTION OF SPURS USING A DITHER SIGNAL

(75) Inventor: Adam B. Eldredge, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 146 days.

(21) Appl. No.: 13/242,803

(22) Filed: Sep. 23, 2011

(65) Prior Publication Data
US 2013/0076547 A1   Mar. 28, 2013

(51) Int. Cl.
*H03M 3/00*   (2006.01)
(52) U.S. Cl.
USPC .......................................... 341/143; 341/131
(58) Field of Classification Search
USPC ................................................ 341/131, 143
See application file for complete search history.

(56) References Cited

U.S. PATENT DOCUMENTS

| | | | |
|---|---|---|---|
| 5,834,987 A * | 11/1998 | Dent | 332/127 |
| 5,986,512 A * | 11/1999 | Eriksson | 331/16 |
| 6,600,378 B1 * | 7/2003 | Patana | 331/1 A |
| 7,394,418 B2 * | 7/2008 | Eikenbroek | 341/143 |
| 7,417,510 B2 | 8/2008 | Huang | |
| 2008/0074208 A1 * | 3/2008 | Lee | 332/127 |

* cited by examiner

*Primary Examiner* — Khai M Nguyen
(74) *Attorney, Agent, or Firm* — Abel Law Group, LLP

(57) ABSTRACT

A method includes operating on a sigma-delta modulated signal to reduce a dither signal component in one of a first signal and a second signal, the first signal being an integer portion corresponding to a digital frequency ratio and the second signal corresponding to a fractional portion of the digital frequency ratio. In at least one embodiment of the method, the operation is performed digitally in a frequency synthesizer.

20 Claims, 7 Drawing Sheets

700

| dither Amp (Arb.) | Spur @ Fs=625MHz (dBc) | Broadband Jitter (ps-pp) | Broadband Jitter (ps-rms) |
|---|---|---|---|
| 0 | -68 | 0.63 | 0.22 |
| 0.00001 | -68 | 0.94 | 0.24 |
| 0.0001 | -77 | 1.25 | 0.32 |
| 0.001 | -92 | 1.25 | 0.31 |
| 0.01 | -99 | 1.25 | 0.31 |
| 0.1 | -99 | 1.25 | 0.31 |
| 1 | -99 | 1.25 | 0.31 |

*FIG. 7*

SIGMA-DELTA MODULATION WITH REDUCTION OF SPURS USING A DITHER SIGNAL

BACKGROUND

1. Field

This application is related to clock generation and more particularly to clock generation using sigma-delta modulation.

2. Description of the Related Art

Electronic devices increasingly operate using a wide range of clock frequencies. To synthesize multiple clock frequencies, some devices use multiple oscillators or multiple phase-locked loops. However, such designs may be complex or inefficient in some applications. For example, each phase-locked loop may use a large capacitive loop filter to filter out noise. The capacitive loop filter may be difficult to integrate within a small area. Other devices may employ different techniques to reduce phase noise, but these techniques may also incur power consumption, complexity, size, and cost.

SUMMARY

In at least one embodiment of the invention, a method includes sigma-delta modulating a combination of a dither signal and an input signal to generate a first signal. A signal based on the dither signal is sigma-delta modulated to generate a second signal. The method further includes generating a first control signal based on a difference between the first signal and the second signal. In at least one embodiment, the method further includes generating a first clock signal having a first frequency, dividing the first clock signal according to a first control signal to generate a second clock signal having a second frequency, and generating a third clock signal by adjusting a phase of the second clock signal based on a fractional portion.

In at least one embodiment of the invention, an apparatus includes a first sigma-delta modulator coupled to generate a first signal in response to a dither signal and an input signal. The apparatus further includes a second sigma-delta modulator coupled to generate a second signal in response to the dither signal. The apparatus further includes a first circuit coupled to generate a first control signal based on a difference between the first signal and the second signal. In at least one embodiment, the apparatus further includes an interpolative divider that includes a fractional divider responsive to the first control signal and a phase interpolator responsive to the second control signal.

In at least one embodiment of the invention, a method includes operating on a sigma-delta modulated signal to reduce a dither signal component in one of a first signal and a second signal, the first signal being an integer portion corresponding to a digital frequency ratio and the second signal corresponding to a fractional portion of the digital frequency ratio. In at least one embodiment of the method, the operation is performed digitally in a frequency synthesizer.

BRIEF DESCRIPTION OF THE DRAWINGS

The present invention may be better understood, and its numerous objects, features, and advantages made apparent to those skilled in the art by referencing the accompanying drawings.

FIG. 7 illustrates a table of spurs and jitter measurements for various dither amplitudes consistent with at least one embodiment of the invention.

The use of the same reference symbols in different drawings indicates similar or identical items.

DETAIL DESCRIPTION

Figure 1:
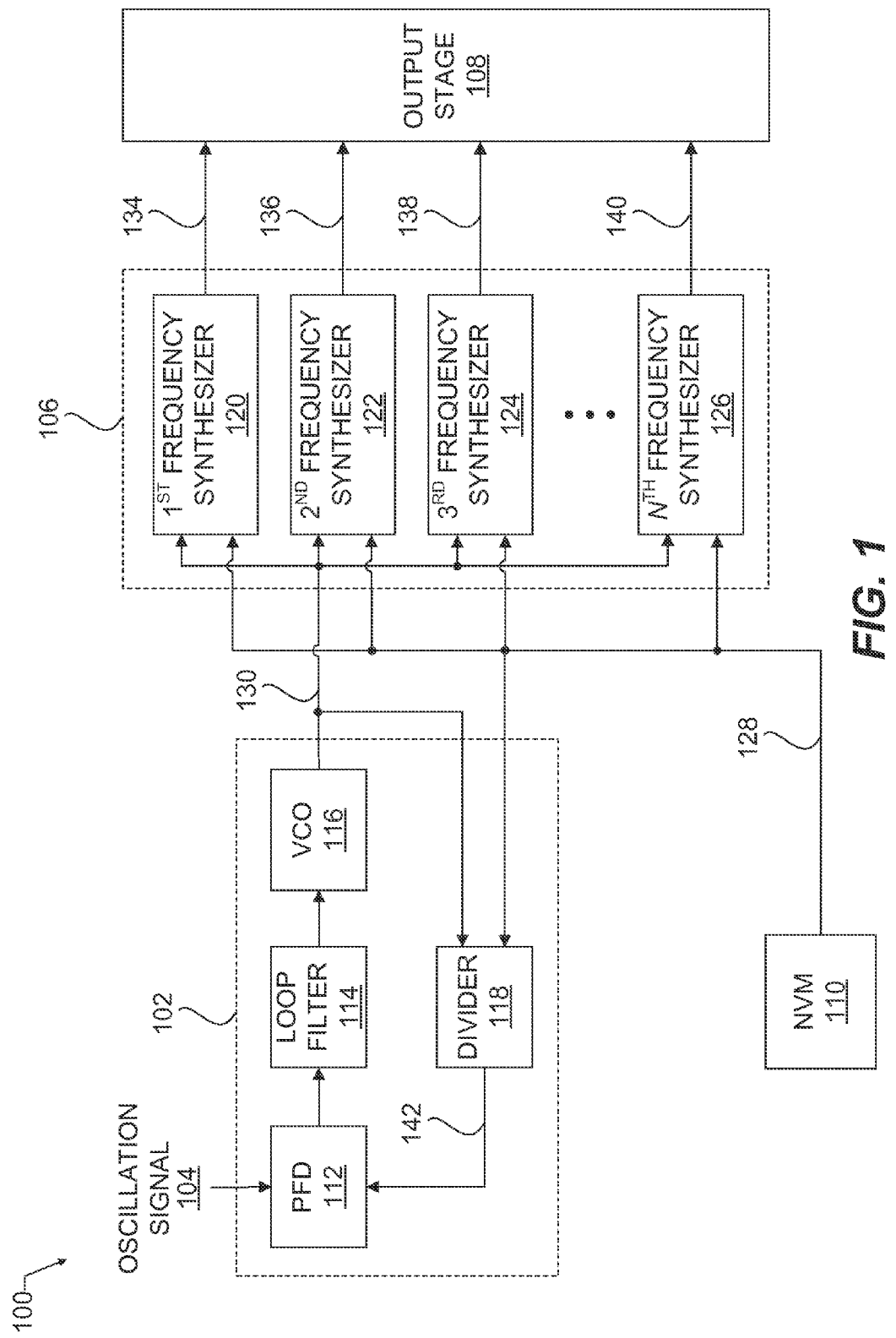
FIG. 1 illustrates a functional block diagram of a frequency translation system consistent with at least one embodiment of the invention.

Referring to FIG. 1, in at least one embodiment, a frequency translation system 100 is operable to generate multiple clock signals having separately configurable frequencies. In at least one embodiment, the multiple clock signals are separately configurable without using separate phase-locked loops or separate oscillators to generate each of the multiple clock signals. In at least one embodiment of frequency translation system 100, multiple clock signals are generated using corresponding clock synthesizers that each include an interpolative divider and an open-loop sigma-delta modulator. Exemplary clock synthesizers that use interpolative dividers which receive control signals from first-order, open loop sigma-delta modulators are described in U.S. Pat. No. 7,417,510 to Huang and in U.S. Provisional Patent Application Ser. No. 60/827,325 to Huang, both of which are incorporated by reference herein in their entirety.

In at least one embodiment of a frequency synthesizer, using an open-loop sigma-delta modulator causes digital spurs in an output clock signal. Techniques for reducing digital spurs in the output clock signal include using higher order sigma-delta modulators to generate the control signals for the interpolative divider. In general, a higher-order sigma-delta modulator introduces high frequency noise in the output clock signal. Another technique for reducing digital spurs in the output clock signal introduces random noise (e.g., dither) at the input of the sigma-delta modulator. However, in some frequency synthesizers, the introduction of the random noise at the input of the sigma-delta modulator may raise the noise floor of the system to unacceptable levels.

In at least one embodiment, frequency translation system 100 includes a frequency synthesis stage, e.g., phase-locked loop 102, which generates clock signal 130 based on oscillation signal 104. In at least one embodiment of frequency translation system 100, oscillation signal 104 is received by a pin (e.g., from an off-chip oscillator) or by an oscillator on-chip. In at least one embodiment, clock signal 130 is synthesized based on oscillation signal 104 (e.g., by using oscillation signal 104 as a reference signal). For example, phase/frequency detector (PFD) 112 may compare a phase of feedback signal 142 to a phase of oscillation signal 104. Loop filter 114 may be responsive to PFD 112 and may output a filtered signal to voltage-controlled oscillator (VCO) 116, which may generate clock signal 130. Divider 118 may generate feedback signal 142 by dividing a frequency of clock signal 130 based on data 128 stored at non-volatile memory (NVM) 110. In other embodiments of frequency translation system 100, clock signal 130 may be received from other suitable clock sources.

An exemplary frequency synthesis stage 106 includes one or more frequency synthesizers, such as frequency synthesizers 120, 122, 124, and 126. In at least one embodiment, frequency synthesis stage 106 generates clock signals 134, 136, 138, and 140, which each have separately configurable clock frequencies. In at least one embodiment, frequency synthesis stage 106 is responsive to clock signal 130 and to data 128, which may be stored at NVM 110, stored in registers, or received by other suitable techniques. An exemplary frequency synthesis stage 106 provides clock, signal 130 and data 128 to frequency synthesizers 120, 122, 124, and 126. In at least one embodiment of frequency translation system 100, frequency synthesizers 120, 122, 124, and 126 are coupled to generate respective synthesized clock signals (e.g., clock signals 134, 136, 138, and 140) based on clock signal 130, as described further below. In at least one embodiment of frequency translation system 100, data 128 includes one or more digital frequency ratios or codes corresponding to digital frequency ratios used to generate the synthesized clock signals.

In at least one embodiment, output stage 108 receives the synthesized clock signals from frequency synthesizers 120, 122, 124, and 126. In at least one embodiment, output stage 108 includes circuitry operable to provide the synthesized clock signals off-chip. An exemplary output stage 108 includes selection logic to select between one or more of the synthesized clock signals for providing to respective output drivers of the output stage 108. In at least one embodiment, the output drivers drive the synthesized clock signals at output terminals of output stage 108. In at least one embodiment, the output stage 108 includes frequency dividers coupled between the selection logic and the output drivers, enabling further frequency division of the selected synthesized clock signals.

Figure 2:
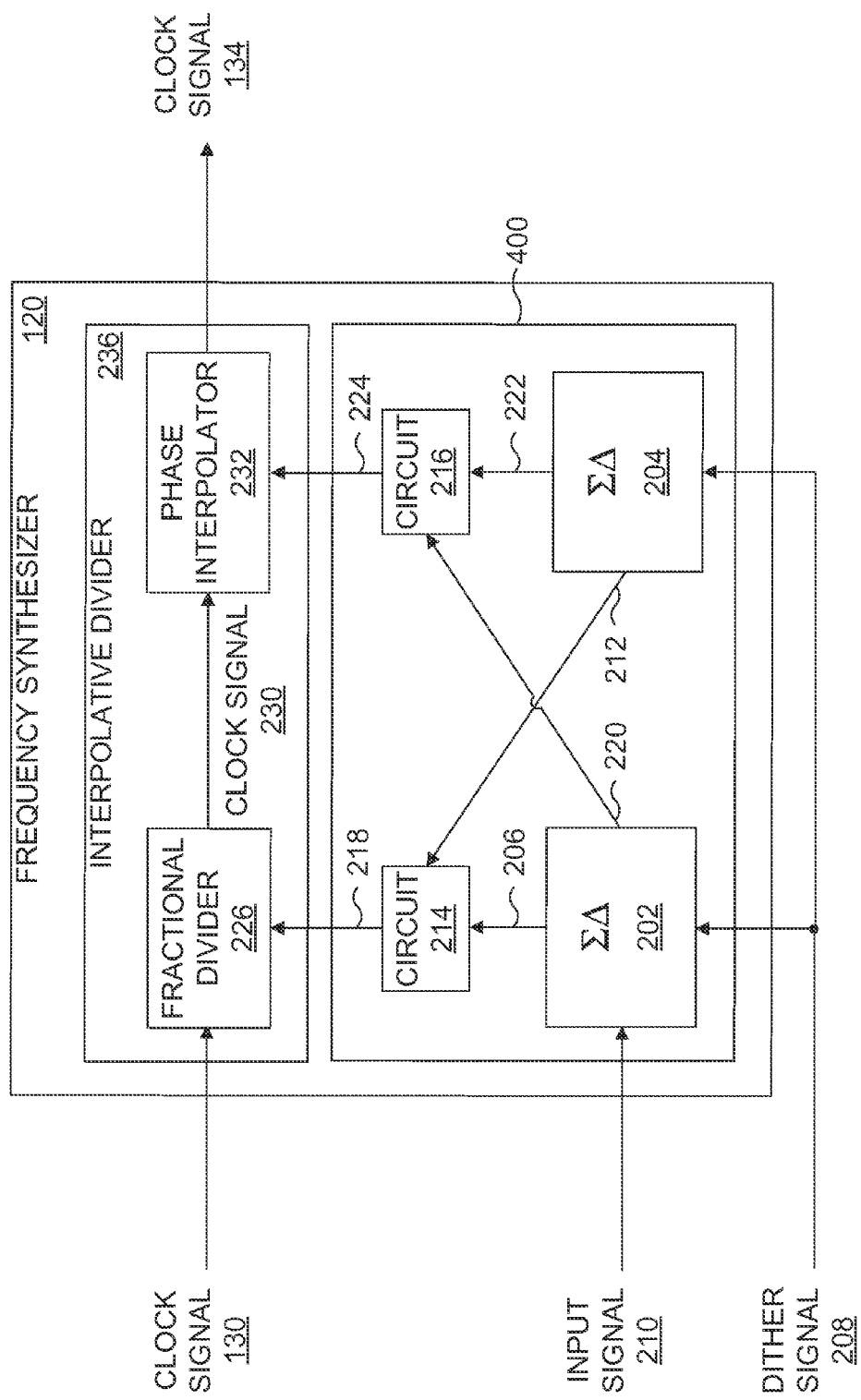
FIG. 2 illustrates a functional block diagram of a frequency synthesizer of the frequency translation system of FIG. 1 consistent with at least one embodiment of the invention.

Referring to FIG. 2, in at least one embodiment, frequency synthesizer 120 includes interpolative divider 236 and sigma-delta modulator module 400, which reduces or eliminates digital spurs in an output clock signal 134 as compared to a frequency synthesizer using a conventional first order sigma-delta modulator. In at least one embodiment, sigma-delta modulator module 400 provides control signals to interpolative divider 236. In at, least one embodiment of frequency synthesizer 120, input signal 210 is a digital frequency ratio translated from a code, e.g., a code provided by NVM 110 of FIG. 1. In at least one embodiment, sigma-delta modulator module 400 includes multiple sigma-delta modulators (e.g., sigma-delta modulator 202 and sigma-delta modulator 204).

In at least one embodiment of frequency synthesizer 120, sigma-delta modulator 202 is responsive to dither signal 208 and input signal 210. For example, sigma-delta modulator 202 sigma-delta modulates a combination of dither signal 208 and input signal 210 to generate signal 206. In at least one embodiment, signal 206 is a stream of integers that approximate the combination of input signal 210 and dither signal 208. For example, an average value of signal 206 corresponds to a value of input signal 210. In at least one embodiment of sigma-delta modulator 202, dither signal 208 is a pseudorandom binary sequence (PRBS) that is generated using an on-chip pseudorandom number generator (e.g., a series of registers corresponding to a polynomial function), although other suitable techniques for generating random or pseudorandom signals may be used.

In at least one embodiment, sigma-delta modulator 202 is further responsive to dither signal 208 and input signal 210 to generate signal 220. In at least one embodiment of sigma-delta modulation module 400, signal 220 is a representation of the digital quantization error corresponding to the fractional portion of the combination of input signal 210 and dither signal 208. In at least one embodiment, signal 220 is quantized to a higher level (e.g., is represented using more bits) than signal 206.

In at least one embodiment, sigma-delta modulator 204 generates signal 212 responsive to dither signal 208. In at least one embodiment of sigma-delta modulator 204, signal 212 corresponds to a stream of integers that approximate dither signal 208. In at least one embodiment, sigma-delta modulator 204 generates signal 222 in response to dither signal 208. In at least one embodiment of sigma-delta modulator 204, signal 222 is quantized to a higher level (e.g., is represented using more bits) than signal 212. In at least one embodiment, signal 206 is quantized to the same level as signal 212. In at least one embodiment, signal 220 is quantized to the same level as signal 222.

In at least one embodiment of sigma-delta modulator module 400, circuit 214 is responsive to signal 206 and to signal 212 to remove a dither component from signal 206. For example, circuit 214 may be a difference node that is coupled to generate control signal 218 based on a difference between signal 206 and signal 212. In at least one embodiment of frequency synthesizer 120, control signal 218 corresponds to an integer portion of the digital frequency ratio.

In at least one embodiment, circuit 216 is coupled to generate control signal 224 based on a difference between signal 220 and signal 222. In at least one embodiment, circuit 216 is a difference node that is coupled to subtract signal 222 from signal 220, which removes a dither component from signal 220. In at least one embodiment, control signal 224 corresponds to a fractional portion of the digital frequency ratio.

Figure 4:
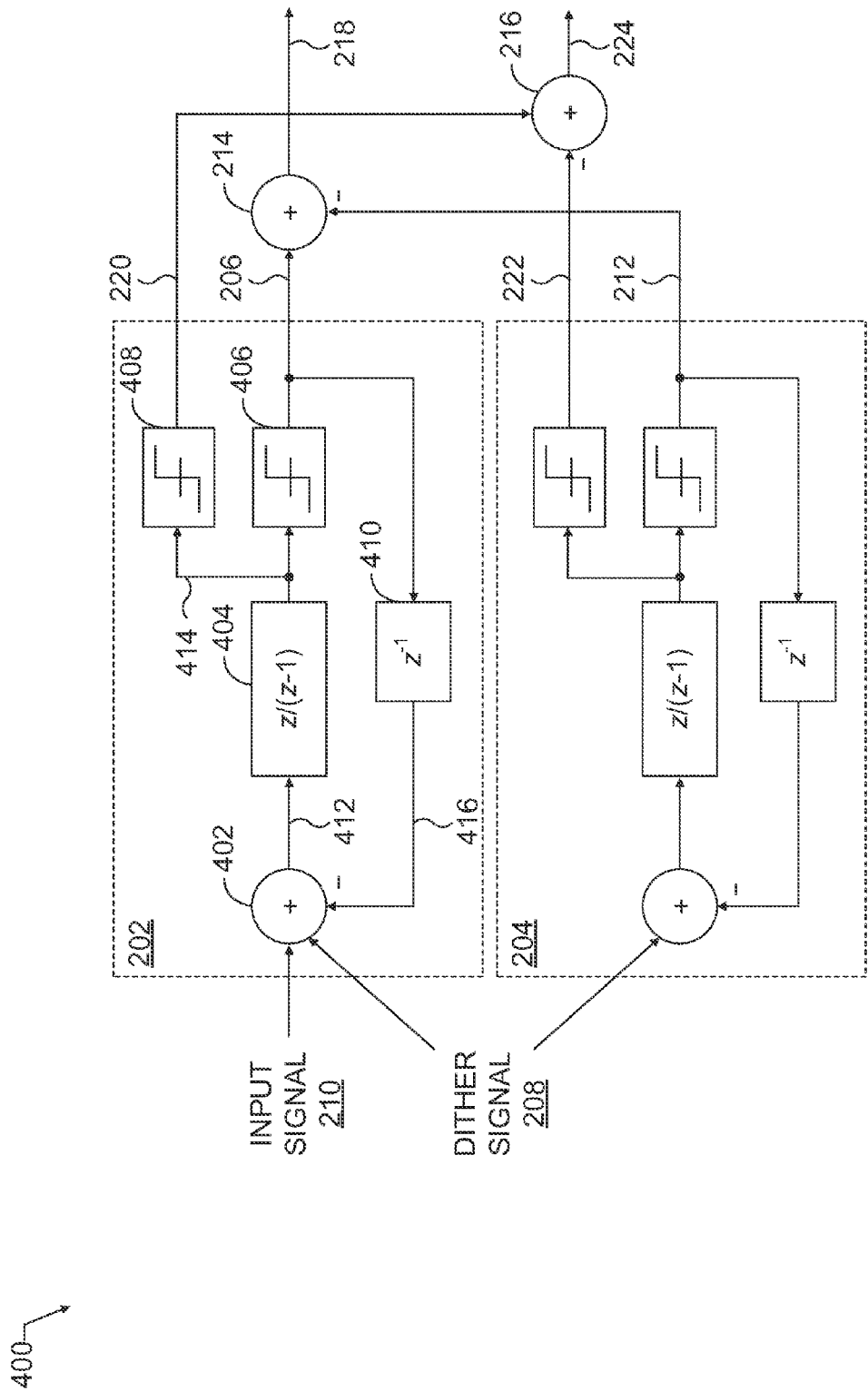
FIG. 4 illustrates a functional block diagram of a sigma-delta modulation module of the frequency synthesizer of FIG. 2 consistent with at least one embodiment of the invention.

FIG. 4 illustrates exemplary embodiments of sigma-delta modulator module 400, which includes sigma-delta modulator 202, sigma-delta modulator 204, circuit 214, and circuit 216. In at least some embodiments, sigma-delta modulator 202 and sigma-delta modulator 204 are first-order sigma-delta modulators. In at least one embodiment, sigma-delta modulator 202 receives input signal 210 and dither signal 208 at circuit 402. In at least one embodiment, circuit 402 generates signal 412, which is the difference between feedback signal 416 and a combination of input signal 210 and dither signal 208. Integrator 404 receives signal 412 and provides integrator output signal 414 to quantizer 406 and to quantizer 408. In at least one embodiment, delay circuit 410 generates feedback signal 416, which is a delayed version of an integer value approximation of integrator output signal 414. In at least the embodiment of FIG. 4, integrator 404 is associated with a frequency domain transfer function of $z/(z-1)$, and delay circuit 410 is associated with a frequency domain transfer function of $z^{-1}$, where z is a complex variable.

Referring back to FIG. 2, in at least one embodiment, interpolative divider 236 enables generation of a clock signal (e.g., clock signal 134) based on an input clock signal (e.g., clock signal 130) separately from other frequency synthesizers 122, 124, and 126 of frequency synthesis stage 106 of FIG. 1. In at least one embodiment, interpolative divider 236 generates clock signal 134 via fractional divider 226 and phase interpolator 232.

In at least one embodiment of interpolative divider 236, fractional divider 226 is coupled to generate clock signal 230 based on control signal 218 and clock signal 130. For example, clock signal 230 may have a frequency that is based on a frequency of clock signal 130 divided by an integer portion of input signal 210. In at least one embodiment of interpolative divider 236, control signal 218 provides a stream of integers that approximate the actual digital frequency ratio. In at least one embodiment, fractional divider 226 includes a counter coupled to count cycles of clock signal 130 and a comparator coupled to determine when the counter has reached the current integer value of the stream of integers (e.g., to determine when an edge of clock signal 230 should be generated).

In at least one embodiment, phase interpolator 232 is responsive to clock signal 230 and to control signal 224 to generate clock signal 134 by interpolating phases of clock signal 230 based on control signal 224. In at least one embodiment, phase interpolator 232 interpolates between phases of clock signal 230 based on a fractional portion indicated by control signal 224, which corresponds to a digital quantization error associated with control signal 218. In at least one embodiment, phase interpolator 232 includes logic to compare the fractional portion to a clock edge of clock signal 230 to determine whether clock signal 230 has the phase indicated by the fractional portion (e.g., to determine if jitter is present) and to interpolate the edge of clock signal 230 based on the determination. In at least one embodiment, phase interpolator 232 provides clock signal 134 to output circuitry (e.g., to output stage 108 described with reference to FIG. 1). In at least one embodiment, the frequency of clock signal 134 is based on the frequency of clock signal 130 divided by a digital frequency ratio indicated by input signal 210, as explained further with reference to FIG. 3.

In at least one embodiment of sigma-delta modulator 202, quantizer 406 provides signal 206, which is a truncated version of integrator output signal 414, and quantizer 408 provides signal 220, which is the truncated portion of integrator output signal 414. In at least one embodiment, quantizer 406 is a one-bit quantizer that quantizes integrator output signal 414 to generate signal 206 having a value of 1 or −1. In at least one embodiment, quantizer 408 is a multi-bit quantizer (e.g., an 8-bit quantizer).

In at least one embodiment of sigma-delta modulator 204, components and operation of sigma-delta modulator 204 are similar to those of sigma-delta modulator 202, except that sigma-delta modulator is not responsive to input signal 210. In at least one embodiment of sigma-delta modulator 204, only dither signal 208 is input to sigma-delta modulator 204 and sigma-delta modulator 204 generates signal 212 and signal 222, which correspond to an integer approximation of dither signal 208 after sigma-delta modulation and the associated quantization error, respectively.

In at least one embodiment of sigma-delta modulation module 400, circuit 214 performs an operation on signal 206 and signal 212 to generate control signal 218. The operation reduces e.g., removes or substantially removes) a dither signal component of signal 206 (e.g., by subtraction). In at least one embodiment of sigma-delta modulation module 400, input signal 210 corresponds to a digital frequency ratio and control signal 218 corresponds to an integer portion of the digital frequency ratio. For example, as described with reference to FIG. 3, input signal 210 may correspond to a digital frequency ratio (e.g., 2.25) and control signal 218 may correspond to a stream of integers that approximate the digital frequency ratio.

In at least one embodiment of sigma-delta modulator module 400, circuit 216 performs an operation on signal 220 and signal 222, such as subtraction of signal 222 from signal 220, to generate control signal 224. In at least one embodiment, subtraction of signal 222 from signal 220 reduces or eliminates a dither signal component of signal 220. In at least one embodiment, control signal 224 represents digital quantization error corresponding to the fractional portion of the digital frequency ratio. For example, as described with reference to FIG. 3, for a digital frequency ratio of 2.25, control signal 224 may indicate quantization errors 0.25, 0.5, 0.75, 0.00, and 0.25 for respective ones of the stream of integers 2, 2, 2, 3, and 2. In at least one embodiment, the quantization errors indicated by control signal 224 are used by phase interpolator 232 of FIG. 2 to adjust phases of clock signal 230.

Figure 5:
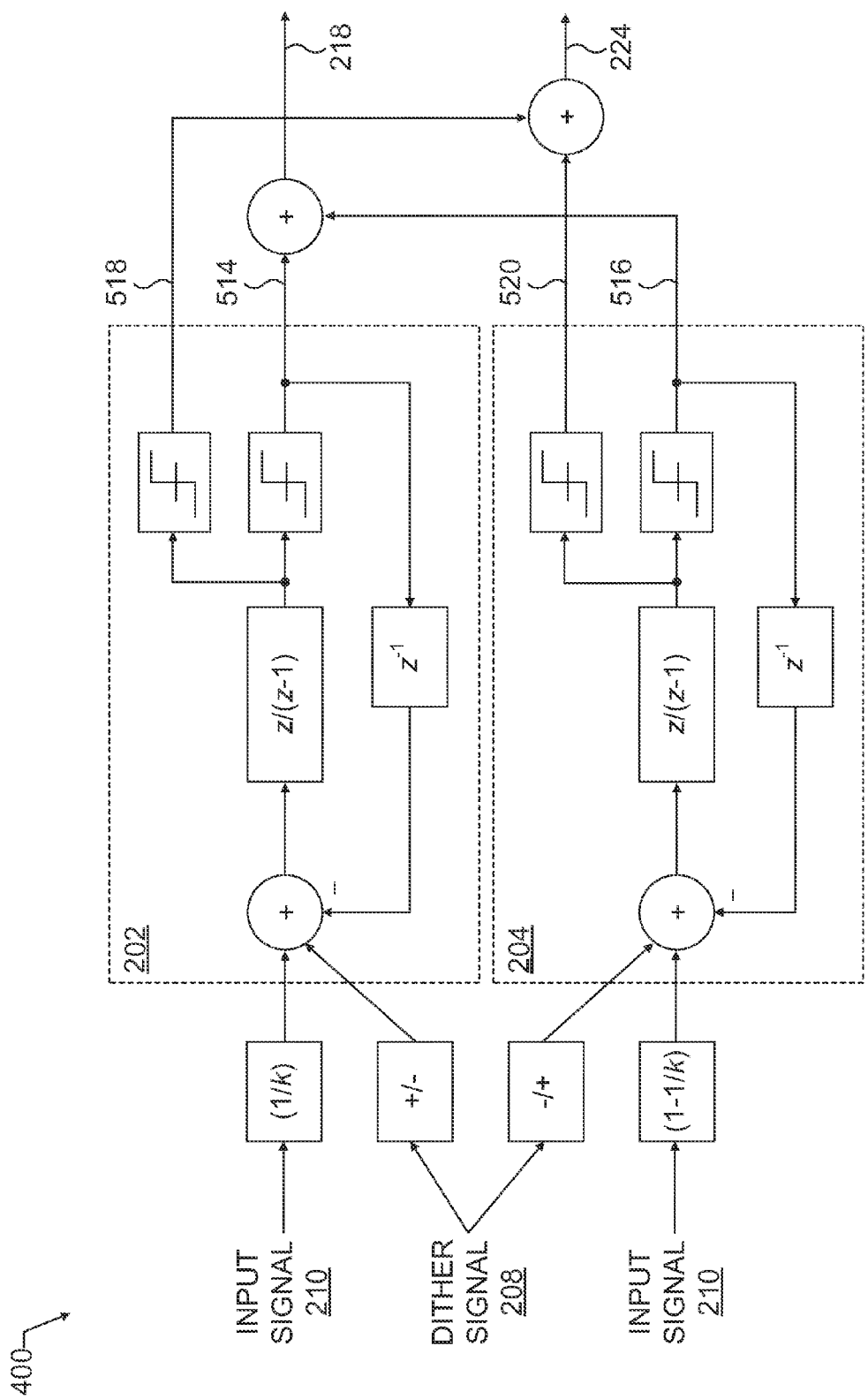
FIG. 5 illustrates a functional block diagram of a mathematical equivalent of the sigma-delta modulation module of FIG. 4 consistent with at least one embodiment of the invention.

Referring to FIG. 5, in at least one embodiment of frequency synthesizer 120, sigma-delta modulator module 400 includes sigma-delta modulator 202 and sigma-delta modulator 204 that are configured to receive different combinations of dither signal 208 and input signal 210 while outputting signals (e.g., control signal 218 and control signal 224) that are mathematically equivalent to those generated by sigma-delta modulator 400 FIG. 4.

In at least the embodiment of sigma-delta modulator module 400, sigma-delta modulator 202 and sigma-delta modulator 204 receive a weighted version of input signal 210 and dither signal 208 is summed (or subtracted) from the weighted version of input signal 210. For example, sigma-delta modulator 202 is responsive to dither signal 208 and to input signal 210 weighted by (1/k), where $0 \leq 1/k \leq 1$. Further, sigma-delta modulator 204 is responsive to dither signal 208 which is subtracted (or summed) weighted by −/+ with input signal 210, which is weighted by (1−1/k).

As shown in FIG. 5, summing signal 514 and signal 516 generates control signal 218. Summing signal 514 and signal 516 removes a dither component from signal 514, since one of signal 514 and signal 516 is based on a sum of dither signal 208 and the first weighted input signal and the other of signal 514 and signal 516 is based on a difference of the second weighted input signal and dither signal 208.

Summing signal 518 and signal 520 generates control signal 224. Summing signal 518 and signal 520 removes a dither component from signal 518, since one of signal 518 and signal 520 is based on a sum of the first weighted input signal and dither signal 208 and the other of signal 518 and signal 520 is based on a difference between dither signal 208 and the second weighted input signal.

Figure 3:
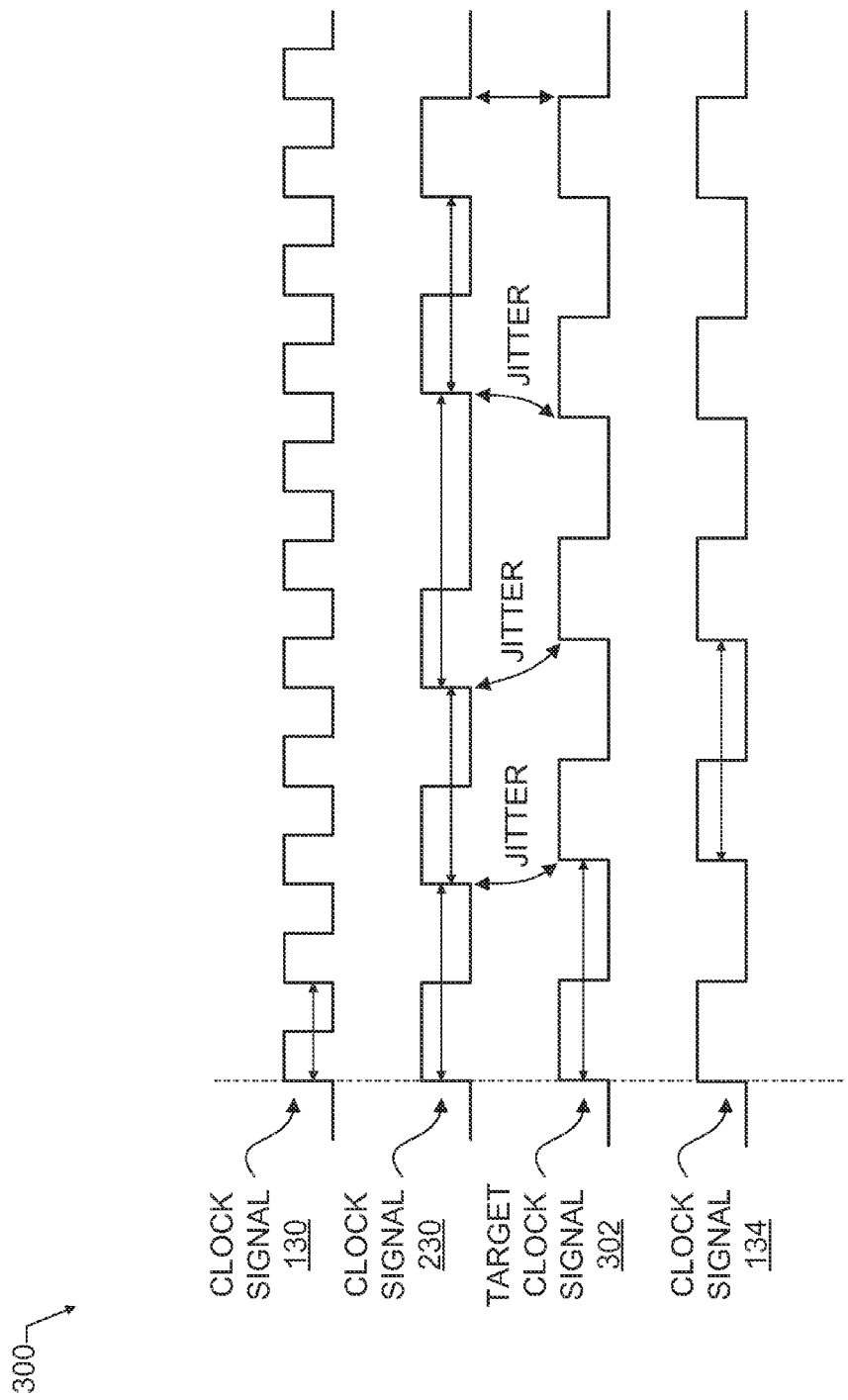
FIG. 3 illustrates a timing diagram depicting exemplary operation of the frequency synthesizer of FIG. 2.

Referring to FIG. 3, timing diagram 300 depicts that clock signal 230 has a frequency that is based on dividing the frequency of clock signal 130 by an integer portion of a digital frequency ratio. As shown in FIG. 3, the frequency of clock signal 130 is divided based on the stream of integers provided by control signal 218 of FIG. 2, which approximate a digital frequency ratio, e.g., 2.25. In particular, FIG. 3 shows that the first four clock cycles of clock signal 130 may be divided by 2, 2, 3, and 2, respectively, to generate clock signal 230.

Because clock signal 130 is divided by a stream of integers approximating the digital frequency ratio rather than the actual digital frequency ratio, clock signal 230 may exhibit jitter. As shown in FIG. 3, phases of clock signal 230 may exhibit jitter by leading or lagging respective phases of target clock signal 302. Because some phases of clock signal 230 may repeatedly lead or lag by a relatively fixed amount (e.g., an amount determined by the difference between an integer value and the corresponding actual digital frequency ratio), the jitter may appear as spurs in the frequency spectrum of clock signal 230. Such spurs degrade frequency resolution of clock signal 230. It should be appreciated that the timing diagram 300 of FIG. 3 is an illustrative and non-limiting example.

Clock signal 134 illustrates an exemplary output signal that is generated based on phase-interpolated versions of clock signal 230 and further based on quantization error indicated by control signal 224. Clock signal 134 has the frequency of target clock signal 302. In at least one embodiment, clock signal 134 has a frequency spectrum that does not include digitally-caused spurs, since for example clock signal 134 does not include the jitter described with reference to clock signal 230. In at least one embodiment, jitter of clock signal 134 (if any) with respect to target clock signal 302 is less than two least-significant bits.

Figure 6:
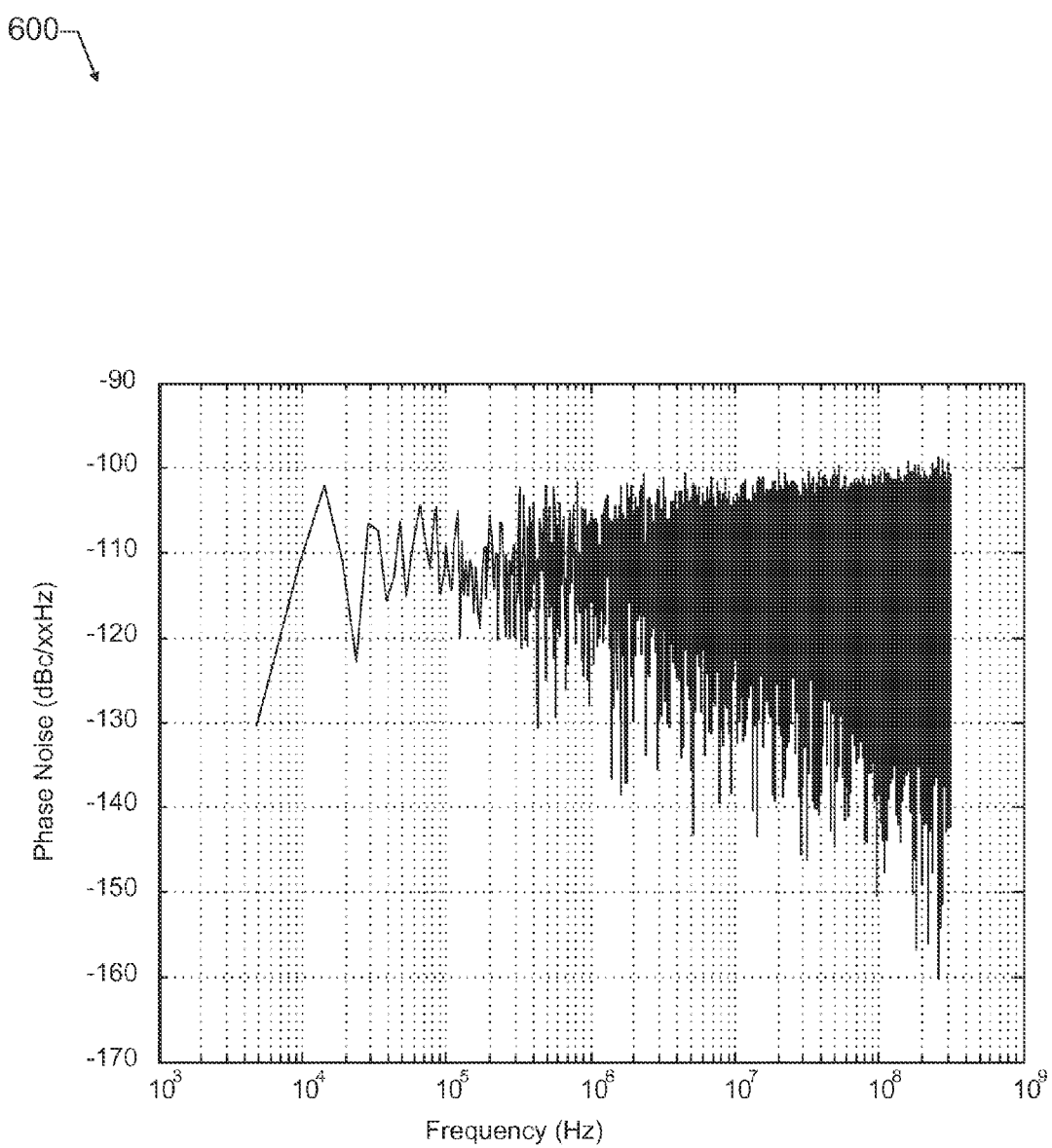
FIG. 6 illustrates a graph of phase noise as a function of frequency consistent with at least one embodiment of the invention.

Referring to FIG. 6, graph 600 illustrates exemplary operational parameters consistent with various embodiments of the invention. For example, graph 600 depicts an exemplary phase noise characteristic associated with clock signal 134 generated by an embodiment of frequency synthesizer 120 of FIGS. 1 and 2. As shown in FIG. 6, the phase noise characteristic is substantially flat. Graph 600 further illustrates that the phase noise characteristic of a corresponding embodiment of frequency synthesizer 120 consistent with the teachings herein does not include digitally-caused spurs above the noise floor.

Referring to FIG. 7, table 700 depicts effects of dither signal amplitude relative to input signal amplitude on digital spurs in the output signal. For example, the amplitude of dither signal 208 of FIGS. 2, 4, and 5 may be varied with respect to the amplitude of input signal 210 of FIGS. 2, 4, and 5, which may affect a phase noise characteristic of clock signal 134 of FIGS. 1-3. Table 700 depicts that in at least one embodiment, the dither signal has an amplitude that can vary from 0 (e.g., when no dither is being applied) to 1 (e.g., approximately equal to an amplitude of the input signal), where amplitude is represented in arbitrary units. As shown in table 700, for the example operation of FIG. 6, jitter remains substantially constant for dither signal amplitudes greater than 0.0001, while spurs are reduced for dither signal amplitudes greater than 0.0001. Accordingly, table 700 depicts at least one embodiment where an amplitude of the dither signal may be selected such that spurs in the output signal are suppressed without increasing jitter. In at least one embodiment, the amplitude of the dither signal is selected to eliminate digitally-caused spurs or reduce the magnitude of such spurs below the noise floor. In addition, in at least one embodiment, an amplitude of the dither signal is selected such that peak-to-peak jitter of the output signal is less than two least-significant bits.

The description of the invention set forth herein is illustrative, and is not intended to limit the scope of the invention as set forth in the following claims. Other variations and modifications of the embodiments disclosed herein may be made based on the description set forth herein, without departing from the scope of the invention as set forth in the following claims.

What is claimed is:

1. A method comprising:
sigma-delta modulating a combination of a dither signal and an input signal to generate a first signal;
sigma-delta modulating a signal based on the dither signal to generate a second signal; and
generating a first control signal based on a difference between the first signal and the second signal.

2. The method as recited in claim 1,
wherein sigma-delta modulating the combination generates a third signal,
wherein sigma-delta modulating the signal based on the dither signal generates a fourth signal, and
wherein the method further comprises generating a second control signal based on a difference between the third signal and the fourth signal.

3. The method as recited in claim 2,
wherein the input signal corresponds to a digital frequency ratio,
wherein the first control signal corresponds to an integer portion of the digital frequency ratio, the first signal comprising a stream of integers that approximate the digital frequency ratio, and
wherein the second control signal corresponds to a digital quantization error corresponding to a fractional portion of the digital frequency ratio.

4. The method as recited in claim 3, further comprising:
generating a first clock signal having a first frequency; and
dividing the first clock signal according to the first control signal to generate a second clock signal having a second frequency.

5. The method as recited in claim 4, further comprising:
generating a third clock signal by adjusting a phase of the second clock signal based on the fractional portion.

6. The method as recited in claim 5,
wherein a phase noise characteristic associated with the third clock signal does not include digitally-caused spurs,
wherein the third clock signal has a jitter characteristic of no more than two least-significant bits of peak-to-peak jitter, and
wherein the phase noise characteristic is substantially flat.

7. The method as recited in claim 1,
wherein an amplitude of the dither signal is at least half an amplitude of the input signal.

8. The method as recited in claim 7,
wherein the amplitude of the dither signal is approximately equal to the amplitude of the input signal.

9. The method as recited in claim 1,
wherein the signal based on the dither signal is further based on the input signal.

10. An apparatus comprising:
a first sigma-delta modulator coupled to generate a first signal in response to a dither signal and an input signal;
a second sigma-delta modulator coupled to generate a second signal in response to the dither signal; and
a first circuit coupled to generate a first control signal based on a difference between the first signal and the second signal.

11. The apparatus as recited in claim 10,
wherein the first sigma-delta modulator is further coupled to generate a third signal in response to the dither signal and the input signal,
wherein the second sigma-delta modulator is further coupled to generate a fourth signal in response to the dither signal,
and further comprising a second circuit coupled to generate a second control signal indicating a difference between the third signal and the fourth signal.

12. The apparatus as recited in claim 11,
wherein the first sigma-delta modulator includes multiple quantizers coupled to generate the first signal and the third signal, and
wherein the second sigma-delta modulator includes multiple quantizers coupled to generate the second signal and the fourth signal.

13. The apparatus as recited in claim 11, further comprising:
an interpolative divider that includes:
a fractional divider responsive to the first control signal; and
a phase interpolator responsive to the second control signal.

14. The apparatus as recited in claim 13,
wherein the fractional divider is further responsive to a first clock signal, the fractional divider coupled to generate a second clock signal based on the first control signal and based on the first clock signal, and
wherein the phase interpolator is coupled to generate a third clock signal by interpolating phases of the second clock signal based on the second control signal.

15. The apparatus as recited in claim 13,
wherein the interpolative divider is included in a frequency synthesizer having an open-loop configuration.

16. The apparatus as recited in claim 11,
wherein the first sigma-delta modulator and the second sigma-delta modulator are first-order sigma-delta modulators.

17. The apparatus as recited in claim 10,
wherein an amplitude of the dither signal is approximately equal to an amplitude of the input signal.

18. A method comprising:
operating on a sigma-delta modulated signal to reduce a dither signal component in one of a first signal and a second signal, the first signal being an integer portion corresponding to a digital frequency ratio and the second signal corresponding to a fractional portion of the digital frequency ratio.

19. The method as recited in claim 18, further comprising:
sigma-delta modulating a combination of an input signal and a dither signal corresponding to the dither signal component to generate the sigma-delta modulated signal,
wherein an amplitude of the dither signal is approximately equal to an amplitude of the input signal.

20. The method as recited in claim 18,
wherein the operation is performed digitally in a frequency synthesizer.

* * * * *